United States Patent
Son

(10) Patent No.: US 7,990,184 B2
(45) Date of Patent: Aug. 2, 2011

(54) COMPARING DEVICE HAVING HYSTERESIS CHARACTERISTICS AND VOLTAGE REGULATOR USING THE SAME

(75) Inventor: Jae-Hyeak Son, Gwanak-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 33 days.

(21) Appl. No.: 12/642,019

(22) Filed: Dec. 18, 2009

(65) Prior Publication Data

US 2010/0164550 A1 Jul. 1, 2010

(30) Foreign Application Priority Data

Dec. 30, 2008 (KR) .................. 10-2008-0136330

(51) Int. Cl.
*H03K 5/22* (2006.01)
(52) U.S. Cl. ............................ 327/87; 327/89
(58) Field of Classification Search .............. 327/77, 327/82, 85, 87, 89
See application file for complete search history.

(56) References Cited

U.S. PATENT DOCUMENTS

| | | | | |
|---|---|---|---|---|
| 4,810,948 A * | 3/1989 | Takuma | ...................... | 323/280 |
| 4,857,931 A * | 8/1989 | Gulczynski | ................... | 341/156 |
| 5,233,329 A * | 8/1993 | Lippmann et al. | ............ | 340/438 |
| 5,376,834 A * | 12/1994 | Carobolante | ................ | 327/143 |
| 6,826,085 B2 * | 11/2004 | Shimasaki | ................ | 365/185.2 |

* cited by examiner

*Primary Examiner* — Lincoln Donovan
*Assistant Examiner* — William Hernandez
(74) *Attorney, Agent, or Firm* — Sherr & Vaughn, PLLC

(57) ABSTRACT

Embodiments include a comparing device having hysteresis characteristics and a voltage regulator using the same. The voltage regulator includes a comparator which compares a comparison voltage with a reference voltage and outputs a result of the comparison, a switching controller which generates a plurality of switching signals in response to the comparison result, resistors connected in the form of a string to divide the comparison voltage into a plurality of voltages, and a switching box which selects one of the plural voltages as the comparison voltage in response to the switching signals.

19 Claims, 6 Drawing Sheets

Figure 1:
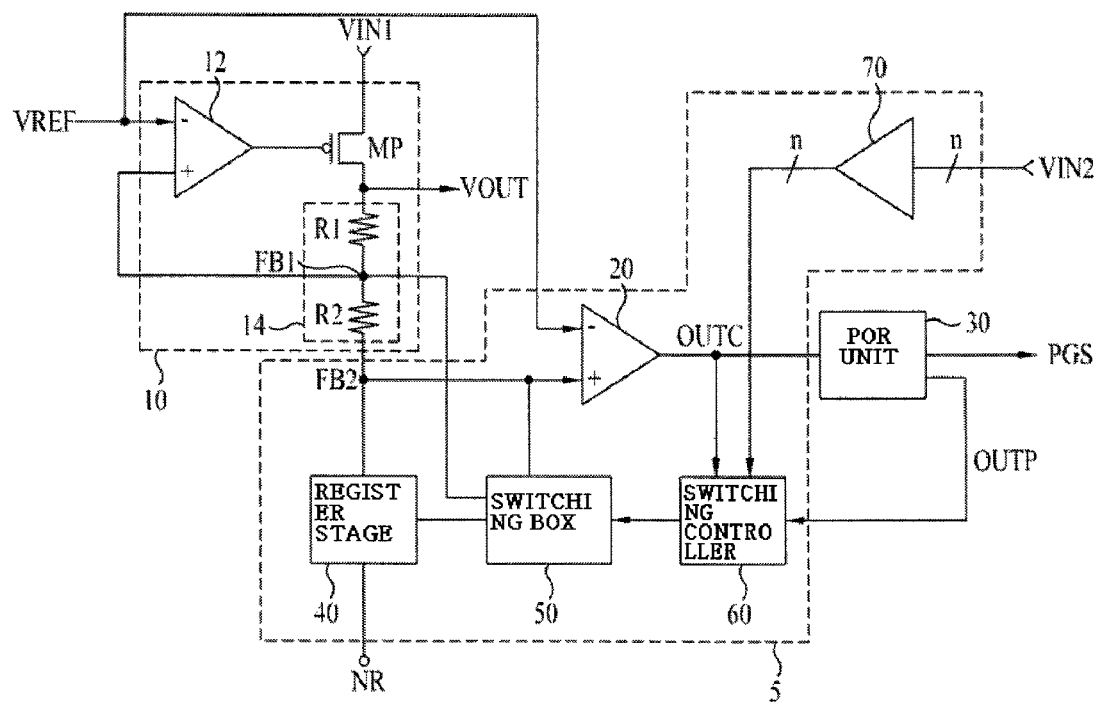

COMPARING DEVICE HAVING HYSTERESIS CHARACTERISTICS AND VOLTAGE REGULATOR USING THE SAME

The present application claims priority under 35 U.S.C. §119 to Korean Patent Application No. 10-2008-0136330 (filed on Dec. 30, 2008), which is hereby incorporated by reference in its entirety.

BACKGROUND

A comparator can generally operate in various stages, such as an input stage to an output stage in sync with a single clock signal. The comparator is generally realized by an amplifier or a latch. One important condition required in the comparator is to eliminate a hysteresis phenomenon in which the state of the current period of the clock signal is forced to be maintained. In this regard, the comparator uses a switch to connect differential outputs, and thus, resets the output of the comparator, for every period of the clock signal. However, switching carried out when latching is begun after output reset may generate a kickback phenomenon in a circuit to drive the comparator. In particular, such a phenomenon inevitably occurs in a single-stage comparator. In this case, there may be direct adverse affect on accuracy.

A comparator compares an input voltage with a reference voltage, amplifies a difference between the input voltage and the reference voltage as the result of the comparison, and outputs the result of the comparison, which has a "high" or "low" logic level. Since the comparator does not have a noise compensation function, it additionally uses a separate analog or digital compensation circuit. As a circuit to solve a noise problem, a Schmitt trigger circuit may be added to the comparator. However, the Schmitt trigger circuit has a drawback in that it is sensitive to a process variation upon determining a positive threshold voltage Vth+ and a negative threshold voltage Vth−, due to characteristics thereof. For this reason, recently-developed comparators themselves are designed to have hysteresis characteristics.

In such a comparator, which has hysteresis characteristics, there is no variation in output even when a voltage input to the comparator is lowered under the condition that the output is maintained at a "high" level while the difference of the voltage from another voltage input to the comparator is "0." When the input voltage, which is continuously lowered, reaches a lower reference voltage, the output is transited from the "high" level to a "low" level. Even when the input voltage rises in this state, the output is maintained at the "low" level. However, when the input voltage reaches an upper reference voltage as it rises continuously, it is transited from the "low" level to the "high" level. Here, hysteresis characteristics mean there are two input voltage points where the output voltage is varied, namely, two input voltage points respectively corresponding to the upper and lower reference voltages.

In order to exhibit high resistance against noise in the above-mentioned comparator having hysteresis characteristics, however, errors may occur in the comparator itself when the hysteresis characteristics of the comparator are varied in accordance with process variation. In this case, there may be a problem in the operation reliability of the entirety of a semiconductor device to which the comparator is applied.

Meanwhile, the comparator may be used in a voltage regulator. A low dropout (LDO) regulator is a linear regulator. The linear regulator is adapted to generate a desired output voltage by eliminating an excessive input voltage using a transistor operating within a linear range. Recently-developed portable appliances require a miniature size, light weight, and long charge life. In order to achieve a long charge life, it is necessary to maximize the use of limited supply power. An effective method capable of solving this problem is to reduce net power consumption.

Meanwhile, various voltages are used in a system. A baseband circuit, an analog to digital converter (ADC), and a digital to analog converter (DAC), which are used in encoder and decoder blocks for data processing, and a spreader and a despreader, which are used for spread spectrum radio frequency (RF) communication, operate at 1.2V, in order to minimize power loss. The voltage output generated by an LDO regulator in a system on chip (SoC) should be supplied to an external appliance under the condition that the voltage output is sufficiently stable. Since the output voltage from the LDO regulator used as a voltage source in the external appliance, malfunction may occur in the external appliance when the output voltage from the LDO regulator is applied to the circuit of the external appliance before the output voltage is converged at a stable level.

In this regard, an error amplifier is used to compare the output voltage from the LDO regulator with a reference voltage, in order to converge the output voltage from the LDO regulator at a normal value. However, when the reference voltage is swung, or the output voltage from the LDO regulator is momentarily swung. there may be a problem in that the error amplifier may output a value of "1" when a value of "0" should be output, or may output a value of "0" when a value of "1" should be output.

SUMMARY

Embodiments relate to a comparator and a voltage regulator using the same, and more particularly, to a comparing device having hysteresis characteristics and a voltage regulator using the same.

Embodiments relate to a comparing device having hysteresis characteristics, in which a voltage input to a comparator is divided in accordance with an output voltage from the comparator, using a digital switch, so that the comparing device is not sensitive to noise.

Embodiments relate to a voltage regulator which prevents a voltage reset signal generated from a power on reset (POR) unit from malfunctioning, using the comparing device having hysteresis characteristics.

In accordance with embodiments, a comparing device having hysteresis characteristics can include at least one of the following: a comparator which compares a comparison voltage with a reference voltage and outputs a result of the comparison, a switching controller which generates a plurality of switching signals in response to the comparison result, resistors connected in the form of a string which divide the comparison voltage into a plurality of voltages, and a switching box which selects one of the plural voltages as the comparison voltage in response to the switching signals.

In accordance with embodiments, a voltage regulator using a comparing device having hysteresis characteristics can include at least one of the following: an error amplifier which compares a reference voltage with a feedback voltage and outputs a result of the comparison as an error value, a pass transistor which passes an input voltage as an output voltage in response to the error value, a level adjuster which adjusts a level of the output voltage passed by the pass transistor, and outputting the level-adjusted voltage as the feedback voltage, a comparator which compares the reference voltage with a comparison voltage corresponding to the feedback voltage output from the level adjuster, a switching controller which generates a plurality of switching signals in response to a result of the comparison executed by the comparator, resistors connected in the form of a string to divide the comparison voltage into a plurality of voltages, a switching box which selects one of the plural voltages as the comparison voltage in response to the switching signals, and a level shifter which shifts a level of a digital input control voltage received from an outside of the voltage regulator and outputs the level-shifted input control voltage to the switching controller.

DRAWINGS

Example FIGS. 1 to 7 illustrates a block diagram a comparing device having hysteresis characteristics in accordance with embodiments.

DESCRIPTION

Reference will now be made in detail to embodiments associated with a comparing device having hysteresis characteristics, examples of which are illustrated in the accompanying drawings.

Example FIG. 1 is a block diagram illustrating a circuit of a voltage regulator using a comparing device having hysteresis characteristics in accordance with embodiments.

As illustrated in example FIG. 1, the comparing device 5, which has hysteresis characteristics in accordance with embodiments, includes a comparator 20, a resistor stage 40, a switch box 50, a switching controller 60, and a level shifter 70.

The comparator 20 compares a comparison voltage FB2 with a reference voltage VREF, and outputs the result of the comparison.

The resistor stage 40 is connected between a terminal FB1, to which a comparison voltage is applied, and a node NR. The resistor stage 40 divides the comparison voltage FB2 into a plurality of voltages. In this case, the node NR may be grounded.

Figure 2:
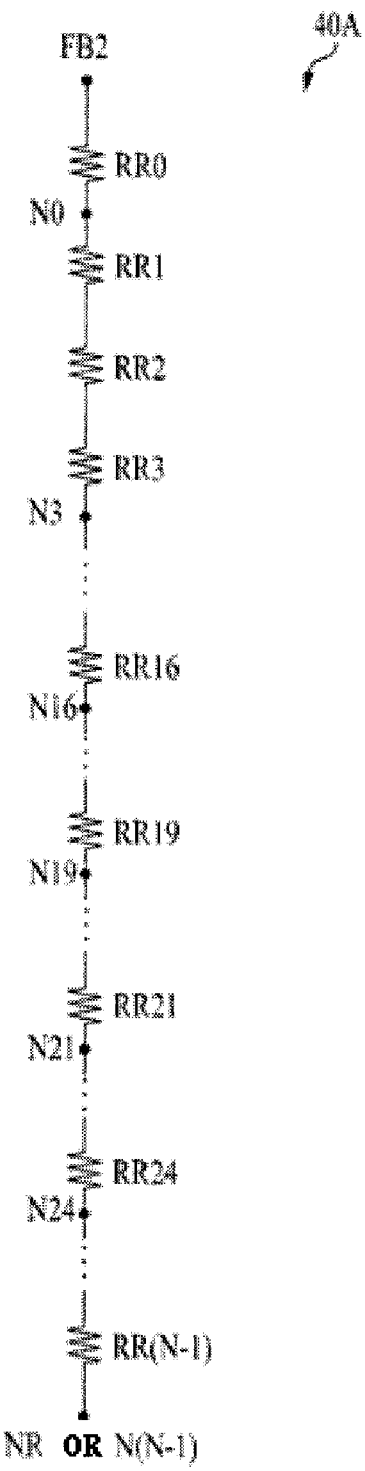

Example FIG. 2 is a circuit diagram illustrating an embodiment 40A of the resistor stage 40 illustrated in FIG. 1 in accordance with embodiments.

As illustrated in example FIG. 2, the resistor stage 40A may include N resistors RR0 to RR(N−1) connected in series in the form of a string between the comparison voltage FB2 and the node NR. As the comparison voltage FB2 is divided into a plurality of voltages having different levels by the resistors RR0 to RR(N−1), these voltages may be generated from respective nodes N0 to NR of the resistors RR0 to RR(N−1).

The switching box 50 selects, as a comparison voltage, one of the plural voltages output from the resistor stage 40, in response to switching signals received from the switching controller 60. The switching box 50 may include a plurality of switches each connected between an associated one of the nodes N0 to NR and a positive input terminal (+) of the comparator 20, namely, the terminal FB1. Through this structure, one of the plural divided voltages may be selected as a comparative voltage in accordance with an ON or OFF operation of each switch included in the switching box 50.

The switching controller 60 generates a plurality of switching signals in response to the comparison result output from the comparator 20, to control the switching box 50. In accordance with embodiments, the plural switches included in the switching box 50 are digital switches. Accordingly, the switching controller 60 can control the ON or OFF operation of each switch of the switching box 50 in a digital manner. In this case, the switching signals are digital signals.

The comparing device 5 may further include the level shifter 70. The level shifter 70 shifts the level of an input control voltage VIN2 received from the outside of the comparing device 5, and then outputs the level-shifted input control voltage VIN2. The input control voltage VIN2 may have the form of an n-bit digital signal. For example, the level shifter 70 may shift the externally-applied input control voltage VIN2, which has a "high" logic level, from a level of 1.2V to a level of 3.3V, and may output the shifted input control voltage VIN2. In this case, the switching controller 60 may generate switching signals, using both the input control voltage VIN2 received from the level shifter 70 and the comparison result received from the comparator 20.

Thus, the comparing device in accordance with embodiments selectively switches on or off in accordance with the comparison result from the comparator 20, thereby causing one of the plural voltages divided by the resistor stage 40 to be supplied to the positive input terminal (+) of the comparator 20. Accordingly, when the comparison result from the comparator 20 is varied in accordance with external environments, one of the two comparison voltages is selectively applied to the positive input terminal (+) of the comparator 20. In this case, the lower one of the two comparison voltage functions as a lower reference voltage, whereas the higher one of the two comparison voltage functions as an upper reference voltage.

The comparing device in accordance with embodiments has hysteresis characteristics because there are two points where the comparison result from the comparator 20 varies, and the two points correspond to the upper and lower reference voltages, respectively. The comparing device, which has hysteresis characteristics in accordance with illustrated embodiments is applicable to various fields. For better understanding of embodiments, the above-described comparing device, which has hysteresis characteristics, will be described in conjunction with the case in which the comparing device is applied to a voltage regulator, for example, a linear voltage regulator such as a low dropout (LDO) regulator.

Hereinafter, a voltage regulator, which uses the comparing device having hysteresis characteristics in accordance with embodiments will be described with reference to the accompanying drawings. Where the comparing device 5 illustrated in example FIG. 1 is applied to a voltage regulator, the terminal NR of the resistor stage 40 is connected to an output voltage VOUT. Accordingly, the resistor stage 40 may be connected between the terminal FB1 and the output voltage VOUT. The voltage regulator 10 includes an error amplifier 12, a pass transistor MP, and a level adjuster 14. Although the voltage regulator 10 takes the form of an LDO regulator in this case, embodiments are not limited thereto. The error amplifier 12 compares a feedback voltage FB1 with a reference voltage VREF, and outputs the comparison result as an error value to the pass transistor MP. The reference voltage VREF may be generated from a band-gap reference voltage generator (BGR). The reference voltage VREF generated from the BGR is a voltage having a constant level without being affected by temperature, supply voltage, process parameters, etc. Since the structure and operation of the BGR may have a general form, no detailed description thereof will be given.

The pass transistor MP passes the input voltage VIN1, as the output voltage VOUT, in response to the error value output from the error amplifier 12. For this function, the pass transistor MP may be implemented using a PMOS transistor. The PMOS transistor MP has a source connected to the input voltage VIN1, a gate connected to the error value, and a drain connected to the output voltage VOUT. The type of the pass transistor MP is not limited to the PMOS transistor. For the pass transistor MP, transistors of various types may be used. The level adjuster 14 adjusts the level of the output voltage VOUT passed by the pass transistor MP, and outputs the adjusted voltage as the feedback voltage FB1 to the positive input terminal (+) of the error amplifier 12. For this function, the level adjuster 14 may be implemented using, for example, resistors R1 and R2. The resistors R1 and R2 are connected in series between the output voltage VOUT and the comparison voltage FB2. A voltage between the resistors R1 and R2 is output, as the feedback voltage FB1, to the error amplifier 12.

In accordance with embodiments, the voltage regulator shown in FIG. 1 may further include a power on reset (POR) unit 30. The POR unit 30 generates a voltage reset signal, namely, a power good signal (PGS), in response to the comparison result output from the comparator 20. The comparison result of the comparator 20 may be supplied to the POR unit 30 after being delayed for a first predetermined time. The comparison result of the comparator 20 may also be supplied to the switching controller 60 after being delayed for a second predetermined time shorter than the first predetermined time. For this function, a plurality of delays to delay the comparison result for the first and second predetermined times may be further provided between the comparator 20 and the POR unit 30. In this case, each delay may be simply implemented using even numbers of inverters.

The voltage reset signal PGS is a signal informing of the fact that the output voltage VOUT output from the voltage regulator 10 is stable. Where the voltage regulator further includes the POR unit 30, as described above, the switching controller 60 generates a plurality of switching signals in response to the voltage reset signal PGS and the comparison result OUTC, and outputs the generated switching signals to the switching box 50. Since the configuration and operation of the POR unit 30 illustrated in example FIG. 1 may have a general structure, no detailed description thereof will be given. However, it is noted that the POR unit 30 applied to embodiments delays a voltage reset signal, namely, a signal OUTP, for a predetermined time, and then outputs the delayed voltage reset signal, namely, the signal PGS. The switching controller 60 may receive the voltage reset signal OUTP, which is a non-delayed signal, thereby generating switching signals.

Hereinafter, respective configurations of embodiments of the switching box 50 and switching controller 60 in accordance with embodiments will be described.

Figure 3:
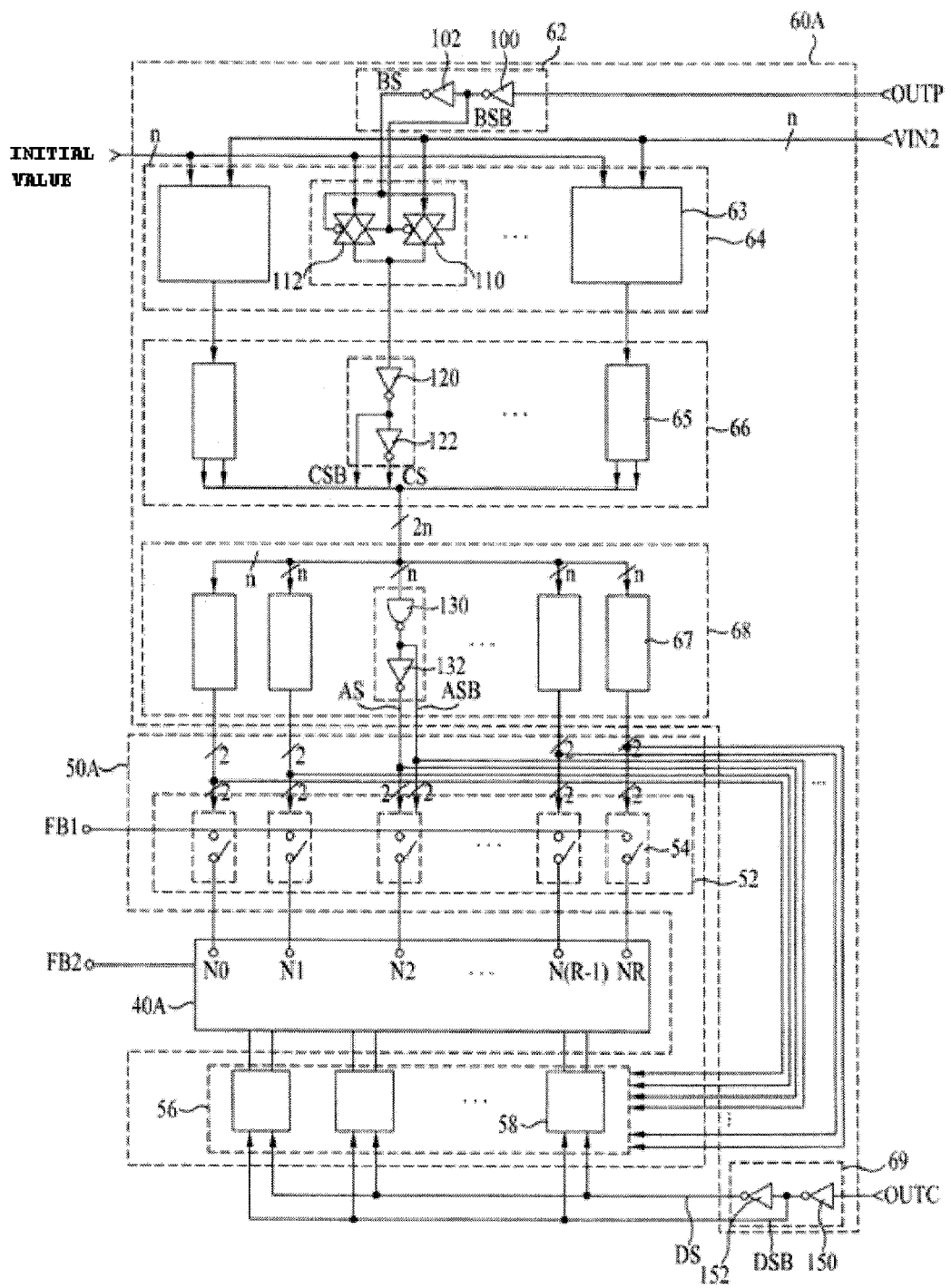

Example FIG. 3 is a circuit diagram illustrating embodiments 50A and 60A of the switching box 50 and switching controller 60 connected to the resistor stage 40 illustrated in example FIG. 1 in accordance with embodiments. As illustrated in example FIG. 3, the switching box 50A includes a first switching stage 52 and a second switching stage 56. The switching controller 60A includes first main control signal generator 62, second main control signal generator 64, third main control signal generator 66, fourth main control signal generator 68 and fifth main control signal generator 69. The first switching stage 52 is connected between each of terminals N0 to NR of the resistor stage 40A and a feedback voltage FB1. For example, the first switching stage 52 may include a plurality of first switches 54. Each of the first switches 54 connects the feedback voltage FB1 to an associated one of the terminals N0 to NR of the resistor stage 40A in response to first select signals AS and ASB. The resistor stage 40A includes resistors connected in the form of a string.

Figure 4:
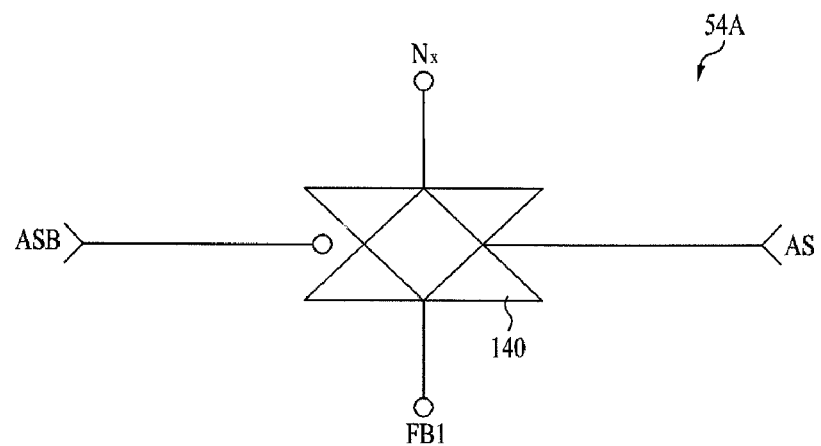

Example FIG. 4 is a circuit of an exemplary embodiment 54A of each first switch 54 shown in example FIG. 3 in accordance with embodiments. As illustrated in example FIG. 4, the first switch 54A includes a transfer gate 140. The transfer gate 140 connects the feedback voltage FB1 to an associated one of the terminals or nodes N0 to NR, namely, the node Nx, in response to the first select signal ASB applied to an inverting control terminal of the transfer gate 140 and the first select signal AS applied to a non-inverting control terminal of the transfer gate 140. Here, "x" is not less than 0, but not more than "N−1" ($0 \leq x \leq N-1$). In this case, the switching controller 60A may generate the first select signals AS and ASB to control the switching operation of the first switching stage 52, in response to a voltage reset signal OUTP and an input control voltage VIN2. For this function, the switching controller 60A may include first main control signal generator 62, second main control signal generator 64, third main control signal generator 66 and fourth main control signal generator 68.

The first main control signal generator 62 receives the voltage reset signal OUTP from the POR unit 30, and outputs an inverted voltage reset signal BSB and a delayed voltage reset signal BS. For this function, the first main control signal generator 62 includes first inverter 100 and second inverter 102. The first inverter 100 inverts the voltage reset signal OUTP, and outputs the resultant signal, namely, the inverted voltage reset signal BSB, to the second main control signal generator 64. The second inverter 102 inverts the output from the first inverter 100, and outputs the resultant signal to the second main control signal generator 64, as the delayed voltage reset signal BSB.

The second main control signal generator 64 selects one of the input control voltage VIN2 and an initial value, in response to the inverted voltage reset signal BSB and the delayed voltage reset signal BS, and outputs the selected input control voltage VIN2 or initial value to the third main control signal generator 66. Here, the initial value has n bits because the input control voltage VIN2 has n bits. For this function, the second main control signal generator 64 may include a plurality of first sub control signal generators 63. Where the number of the string resistors included in the resistor stage 40A is N, the number n of the first sub control signal generators 63 may be expressed by the following Expression 1:

$$n \leq \ln_2 N$$

The reason why "n" may be less than "$\ln_2 N$" in Expression 1 is that only a part of the N resistors included in the resistor stage 40A may be used.

Each of the plural first sub control signal generators 63 may selectively output the input control signal VIN2 or initial value to the third main control signal generator 66, in response to the inverted voltage reset signal. BSB and the delayed voltage reset signal BS. For this function, each first sub control signal generator 53 may be implemented using two transfer gates 110 and 112, as shown in FIG. 3. The transfer gate 110 transfers the input control voltage VIN2 to the third main control signal generator 66, in response to the inverted voltage reset signal BSB applied to an inverting control terminal of the transfer gate 110 and the delayed voltage reset signal BS applied to a non-inverting control terminal of the transfer gate 110. On the other hand, the transfer gate 112 transfers the initial value to the third main control signal generator 66, in response to the delayed voltage reset signal BS applied to an inverting control terminal of the transfer gate 112 and the inverted voltage reset signal BSB applied to a non-inverting control terminal of the transfer gate 110.

The third main control signal generator 66 inverts and delays the output from the second main control signal generator 64, and outputs the resultant signals, namely, the inverted signal CSB and the delayed signal CS, to the fourth main control signal generator 68. For this function, the third main control signal generator 66 may include a plurality of second sub control signal generators 65. The number of the second sub main control signal generators 65 is n. Each first sub control signal generator 65 inverts and delays the output from the associated first sub control signal generator 63 of the second main control signal generator 63, and outputs the resultant signals, namely, the inverted signal and the delayed signal, to the fourth main control signal generator 68. For this function, for example, each second sub control signal generator 65 includes third and fourth inverters 120 and 122. The third inverter 120 inverts the output from the associated first sub control signal generator 63, and outputs the inverted signal CSB. The fourth inverter 122 inverts the output from the third inverter 120, and outputs the inverted signal CS.

The fourth main control signal generator 68 generates the first select signals ASB and AS in response to the output from the third main control signal generator 66. For this function, the fourth main control signal generator 68 may include a plurality of third sub control signal generators 67. The number of the third sub control signal generators 67 may be $2^n$. It can be seen that the fourth main control signal generator 68 functions as a decoder. Each third sub control signal generator 67 generates the first select signals AS and ASB in response to the output from the third main control signal generator 66. For this function, each third sub control signal generator 67 may include a NANDing unit 130 and a fifth inverter 132. The NANDing unit 130 receives associated n bits of the 2n bits output from the third main control signal generator 66, NANDs the received n bits, and outputs the NANDed result as the first select signal ASB. The fifth inverter 132 inverts the output from the NANDing unit 130, and outputs the inverted result as the first select signal AS. The second switching stage 56 is connected between each of the terminals N0 to NR of the resistor stage 40A and the positive input terminal (+) of the comparator 20, to which the comparison voltage is applied, namely, the terminal FB2.

The switching controller 60A generates the second select signal to control the switching operation of the second switching stage 56, in response to the output from the fourth main control signal generator 68 and the comparison result OUTC from the comparator 20. The output from the fourth main control signal generator 68 passes the second switching stage 56 without change. The switching controller 60A may further include a fifth main control signal generator 69. The fifth main control signal generator 69 receives the comparison result OUTC from the comparator 20, and outputs an inverted comparison result DSB and a delayed comparison result DS. For this function, the fifth main control signal generator 69 is implemented using sixth inverter 150 and seventh inverter 152. The sixth inverter 150 inverts the comparison result OUTC from the comparator 20, and outputs the inverted comparison result DSB. The seventh inverter 152 inverts the output from the sixth inverter 150, and outputs the inverted result as the delayed comparison result DS. The above-described second switching stage 56 may include second switches 160.

Figure 5:
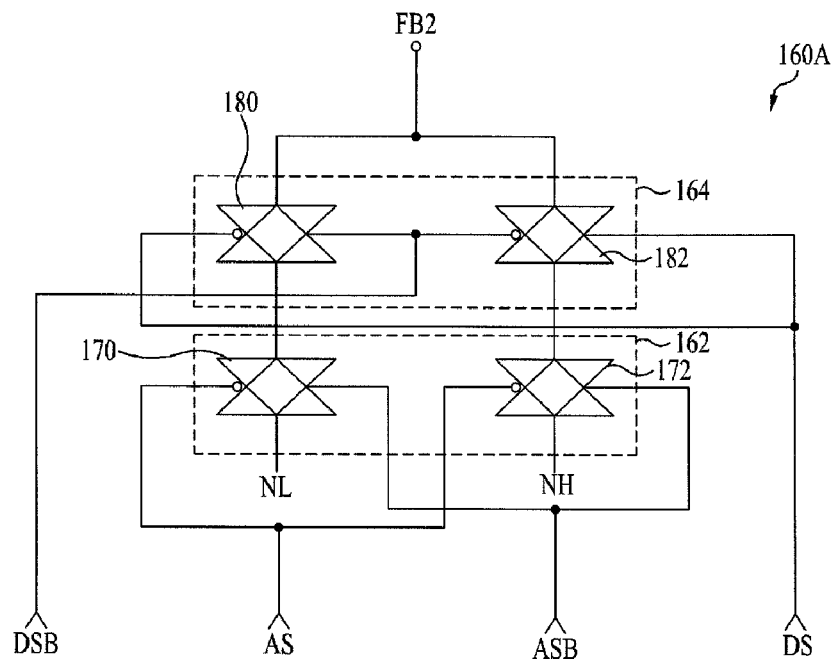

Example FIG. 5 is a circuit diagram illustrating an embodiment 160A of each second switch 160 illustrated in example FIG. 3 in accordance with embodiments. As illustrated in example FIG. 5, each second switch 160 includes first connector 162 and second connector 164. The first connector 162 is connected with associated ones of the terminals N0 to N4 of resistors connected in the form of a string, namely, first and second terminals NL and NH, in response to the first select signals ASB and AS output from the fourth main control signal generator 68. In this case, for hysteresis characteristics, the voltage at the first terminal NL functions as a lower reference voltage, whereas the voltage at the second terminal NH functions as an upper reference voltage. Accordingly, it is possible to connect the second switches 58 and the terminals N0 to NR by previously determining the first and second terminals NL and NH, taking into consideration the above-described fact.

For this function, the first connector 162 may be implemented using two transfer gates 170 and 172. The transfer gate 170 transfers a voltage of the first node NL, for example, the 20-th node N19, to the second connector 164 in response to the first select signal AS applied to an inverting control terminal of the transfer gate 170 and the first select signal ASB applied to a non-inverting control terminal of the transfer gate 170. The transfer gate 172 transfers a voltage of the second node NH, for example, the 25-th node N24, to the second connector 164 in response to the first select signal AS applied to an inverting control terminal of the transfer gate 172 and the first select signal ASB applied to a non-inverting control terminal of the transfer gate 172.

The second connector 164 transfers one of the voltages of the first and second terminals to the terminal (+) of the comparator 20, to which the comparison voltage is applied, namely, the terminal FB2, in response to the output from the fifth main control signal generator 69, namely, the signals DS and DSB. For this function, the second connector 164 may be implemented using transfer gates 180 and 182. The transfer gate 180 transfers a voltage of the first node NL, for example, the 20-th node N19, to the terminal (+) of the comparator 20, in response to the output DS from the fifth main control signal generator 69 applied to an inverting control terminal of the transfer gate 180 and the output DSB from the fifth main control signal generator 69 applied to a non-inverting control terminal of the transfer gate 180.

The transfer gate 182 transfers a voltage of the second node NH, for example, the 25-th node N24, to the terminal (+) of the comparator 20, to which the comparison voltage is applied, in response to the output DSB from the fifth main control signal generator 69 applied to an inverting control terminal of the transfer gate 182 and the output DS from the fifth main control signal generator 69 applied to a non-inverting control terminal of the transfer gate 182.

Hereinafter, operation of the voltage regulator using the comparator having hysteresis characteristics will be described. In the following description, it is assumed that "n" is 4 (n=4), for convenience of description. However, embodiments are not limited to this assumption.

When the voltage VIN1 is externally applied to the LDO regulator 10 shown in FIG. 1, the reference voltage VREF, which is an output from the BGR, is generated after a predetermined time delay is generated. Also, since the error amplifier 12 requires a certain operation time, the value of the output voltage VOUT of the LDO regulator 10 cannot immediately reach a normal value. As a result, the output voltage VOUT may be swung without rising sufficiently when the input voltage VIN1 is input. In this case, the comparison voltage FB2 applied to the comparator 20 may vary in the vicinity of the reference voltage VREF, so that a PGS signal having a "high" or "low" logic level may be repeatedly generated from the POR unit 30. In this case, an external electronic appliance, which recognizes the PGS signal, to use the output voltage VOUT, may malfunction.

The voltage regulator illustrated in example FIG. 1 in accordance with embodiments operates as follows. When the input voltage VIN1 is applied, the reference voltage VREF generated from the BGR has a level of, for example, about 0.6V. The feedback voltage FB1 is applied to the positive input terminal (+) of the error amplifier 12. Where the error amplifier 12 is an ideal operational amplifier, the feedback voltage is continuously fed back to the error amplifier 12, in order to make the feedback voltage FB1 equal to the reference voltage VREF applied to the negative input terminal (−) of the error amplifier 12. Thus, the output voltage VOUT is output in a state of being fixed to a normal level. In order to prevent the output voltage VOUT from being applied to the external electronic appliance during a period before the output voltage VOUT is output in a state of being fixed to a normal level, namely, a transition period, the switching controller 60 controls the switching operation of the switching box 50, to connect the positive input terminal (+) of the comparator 20 to an associated one of the nodes NO to NR of the resistor stage 40. In an initial state, the 17-th terminal N16 of the resistor stage 40 may be connected to the positive input terminal (+) of the comparator 20.

When the voltage of the 17-th terminal N16 is higher than the reference voltage VREF after a predetermined time elapses, the comparison result OUTC output from the comparator 20 has a "high" logic level. Thereafter, the POR unit 30 externally generates the signal PGS after a time required to charge a capacitor, to inform of the fact that the external electronic appliance may use the output voltage VOUT. At the same time, a power reset signal OUTP having a "high" logic level is applied to the first main control signal generator 62. In this case, the input control voltage VIN2 output from the level shifter 70 is processed, as the first select signal, through the second, third, and fourth main control signal generators 64, 66, and 68. In this case, the processed first select signal controls the first switching stage 52, to connect the terminal FB1 and the associated terminal of the resistor stage 40A.

If the input control voltage VIN2 is "0011", the terminal FB1 may be connected to the fourth terminal N3 in the following manner. Upon receiving a voltage reset signal OUTP having a "low" logic level, the first main control signal generator 62 selects the initial value, to control the second main control signal generator 62 such that the initial value is output to the third main control signal generator 66. Upon receiving a voltage reset signal OUTP having a "high" logic level, however, the first main control signal generator 62 selects the input control voltage VIN2, which is "0011", thereby controlling the second main control signal generator 64 such that the input control voltage VIN2 is output to the third main control signal generator 66.

Upon receiving the input control voltage VIN2 of "0011" from the second main control signal generator 64, the third main control signal generator 66 generates signals of "01", "01", "10", and "10" from the left to the right when the signal generated from the leftmost second sub control signal generator 65 is a most significant bit (MSB), and the signal generated from the rightmost second sub control signal generator 65 is a least significant bit (LSB). As a result, the first select signal AS generated from the third sub control signal generator 67 arranged at a fourth position from the left in the fourth main control signal generator 68 has a value "1."

Accordingly, where the first switches 54 of the first switching stage 52 are implemented as shown in FIG. 4, the switch 54 arranged at a fourth position from the left is turned on, so that the voltage of the node N3 is connected with the feedback voltage FB1. In this case, since the first select signal AS output from the third sub control signal generator 67 arranged at a fourth position from the left in the fourth main control voltage generator 68 has a value "1", the voltages of the first and second node NL and NH, for example, the nodes N19 and N24, are transferred to the second connector 164 through the second switches 58 selected by the first select signal AS. When the comparison result OUTC subsequently output from the comparator 20 has a "low" logic level, the voltage of the first node NL, namely, the node N19, is applied to the positive input terminal (+) of the comparator 20. On the other hand, when the comparison result OUTC output from the comparator 20 has a "high" logic level, the voltage of the second node NH, namely, the node N24, is applied to the positive input terminal (+) of the comparator 20.

In accordance with the above-described operation, the comparing device 5 illustrated in example FIG. 1 switches the voltage of the first node NL, namely, the node N19, and the voltage of the second node NH, namely, the node N24, in accordance with the comparison result output from the comparator 20. Thus, it can be seen that the comparing device 5 has hysteresis characteristics.

Figure 6A:
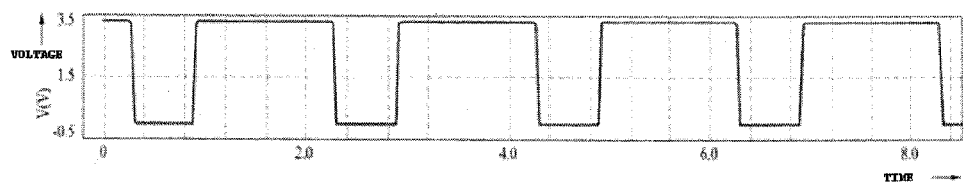
Figure 6B:
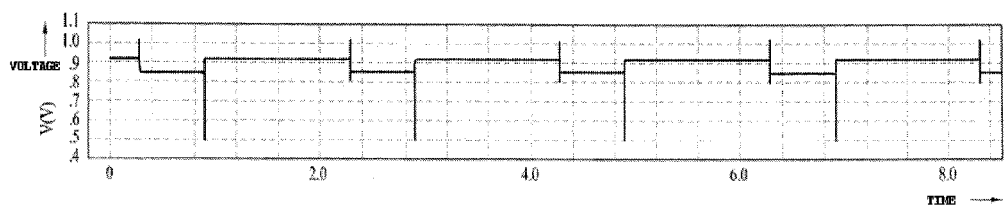
Figure 6C:
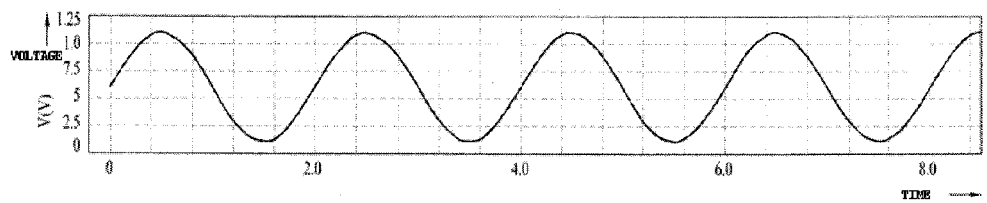
Figure 6D:
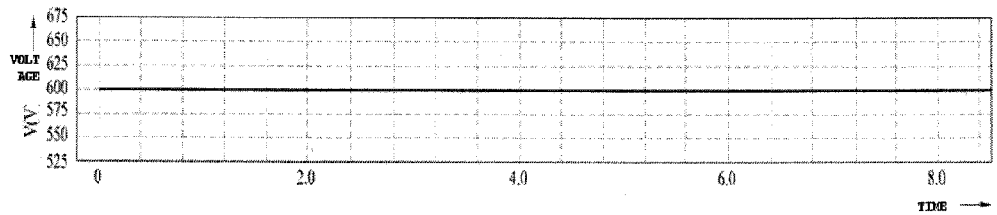
Figure 7:
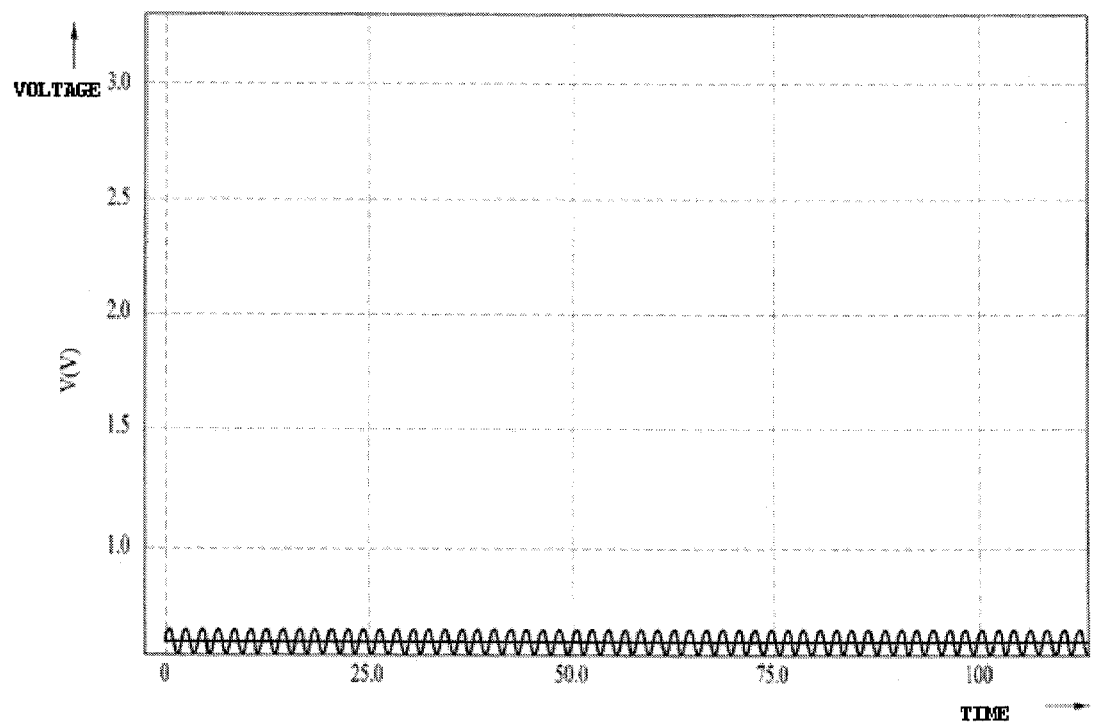

Example FIGS. 6 to 7 are graphs which explain noise characteristics in accordance with embodiments. In the graphs, the vertical axis represents voltage, and the horizontal axis represents time.

Example FIG. 6A illustrates a waveform diagram of a signal output from the fifth main control signal generator 69. Example FIG. 6B illustrates a waveform diagram of a voltage applied to the positive input terminal (+) of the comparator 20. Example FIG. 6C illustrates a waveform of the reference voltage VREF, which is swung. Example FIG. 6D illustrates a waveform of the reference voltage VREF, which is fixed. Example FIG. 7 is a graph illustrating both the reference voltages of FIGS. 6C and 6D.

As illustrated in example FIG. 7, it can be seen that there is no voltage swing caused by noise under the hysteresis condition. The comparing device having hysteresis characteristics in accordance with embodiments and the voltage regulator using the same can adjust a voltage applied to an input terminal of a comparator, using a resistor stage having a negative feedback function and a digital switch circuit. Accordingly, it is possible to vary hysteresis characteristics even when the level of a comparison signal (or an input signal) applied to the comparator is varied, when various input signals are used, or when severe noise is generated.

In accordance with embodiments, it is possible to provide hysteresis characteristics using a switching box and a resistor stage, in place of using, for reduction of noise generated in circuits, a noise removing circuit block or a Schmitt trigger circuit, which is sensitive to an offset generated during a CMOS process or ambient temperature. Accordingly, it is possible to reduce affect of noise generated in circuits while most reducing influence of peripheral environments or an offset generated during the CMOS process. Where the above-described comparing device is applied to a voltage regulator such as an LDO regulator, it is possible to accurately inform an external appliance of a point of time when an output voltage from the voltage regulator is normally output.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A comparing device having hysteresis characteristics comprising:
   a comparator which compares a comparison voltage with a reference voltage and outputs a result of the comparison;
   a switching controller which generates a switching signal in response to the comparison result;
   resistors connected in the form of a string to divide the comparison voltage into a plurality of voltages;
   a switching box which selects one of the plurality of voltages as the comparison voltage in response to the switching signal; and
   a level shifter which shifts a level of a digital input control voltage received from an outside of the comparing device and outputs a level-shifted digital input control voltage to the switching controller.

2. A voltage regulator using a comparing device having hysteresis characteristics, the voltage regulator comprising:
   an error amplifier which compares a reference voltage with a feedback voltage and outputs a result of the comparison as an error value;
   a pass transistor which passes an input voltage as an output voltage in response to the error value;
   a level adjuster which adjusts a level of the output voltage passed by the pass transistor and outputs the level-adjusted voltage as the feedback voltage;
   a comparator which compares the reference voltage with a comparison voltage corresponding to the feedback voltage output from the level adjuster;
   a switching controller which generates a switching signal in response to a result of the comparison executed by the comparator;
   resistors connected in the form of a string to divide the comparison voltage into a plurality of voltages;
   a switching box which selects one of the plurality of voltages as the comparison voltage in response to the switching signal; and
   a level shifter which shifts a level of a digital input control voltage received from an outside of the voltage regulator and outputs a level-shifted digital input control voltage to the switching controller.

3. The voltage regulator of claim 2, further comprising:
   a power on reset unit which generates a voltage reset signal in response to the comparison result from the comparator,
   wherein the switching controller generates the switching signal in response to the voltage reset signal and the comparison result from the comparator.

4. The voltage regulator of claim 3, wherein:
   the power on reset unit outputs the voltage reset signal after delaying the voltage reset signal for a predetermined time; and
   the switching controller receives the voltage reset signal before the delay.

5. The voltage regulator of claim 4, wherein the switching box comprises:
   a first switching stage connected between each of nodes among the string resistors and the feedback voltage, wherein the switching controller generates a first select signal to control a switching operation of the first switching stage in response to the voltage reset signal.

6. The voltage regulator of claim 5, wherein the switching controller comprises:
   a first main control signal generator which receives the voltage reset signal and outputs an inverted voltage reset signal and a delayed voltage reset signal;
   a second main control signal generator which selectively outputs the level-shifted digital input control voltage or an initial value in response to the inverted voltage reset signal and the delayed voltage reset signal;
   a third main control signal generator which delays the output from the second main control signal generator and outputs the delayed output; and
   a fourth main control signal generator which generates the first select signal in response to the output from the third main control signal generator.

7. The voltage regulator of claim 6, wherein the first main control signal generator comprises:
   a first inverter which inverts the voltage reset signal and outputs a result of the inversion as the inverted voltage reset signal; and
   a second inverter which inverts the output from the first inverter and outputs the inverted output as the delayed voltage reset signal.

8. The voltage regulator of claim 6, wherein the second main control signal generator comprises a plurality of first sub control signal generators each adapted to selectively output the level-shifted digital input control voltage or the initial value in response to the inverted voltage reset signal and the delayed voltage reset signal.

9. The voltage regulator of claim 8, wherein each of the plural first sub control signal generators comprises:
   a first transfer gate which transfers the level-shifted digital input control voltage in response to the inverted voltage reset signal applied to an inverting control terminal of the first transfer gate and the delayed voltage reset signal applied to a non-inverting control terminal of the first transfer gate; and
   a second transfer gate which transfers the initial value in response to the delayed voltage reset signal applied to an inverting control terminal of the second transfer gate and the inverted voltage reset signal applied to a non-inverting control terminal of the second transfer gate.

10. The voltage regulator of claim 9, wherein the third main control signal generator comprises a plurality of second sub control signal generators which delay and invert the output from the second main control signal generator.

11. The voltage regulator of claim 10, wherein each of the plural second sub control signal generators comprises:
    a third inverter which inverts an output from an associated one of the first sub control signal generators; and
    a fourth inverter which inverts an output from the third inverter.

12. The voltage regulator of claim 6, wherein the fourth main control signal generator comprises a plurality of third sub control signal generators each adapted to generate the first select signal in response to the output from the third main control signal generator.

13. The voltage regulator of claim 12, wherein each of the third sub control signal generators comprises:
    a NANDing unit which NANDs the output from the third main control signal generator; and
    a fifth inverter which inverts an output from the NANDing unit and outputs a result of the inversion as the first select signal.

14. The voltage regulator of claim 6, wherein:
    the switching box comprises a second switching stage connected between each of nodes among the string resistors and a terminal of the comparator, to which the comparison voltage is applied, wherein the switching controller generates a second select signal to control a switching operation of the second switching stage in response to an output from the fourth main control signal generator and the comparison result from the comparator.

15. The voltage regulator of claim 14, wherein the switching controller further comprises a fifth main control signal generator which receives the comparison result from the comparator and outputs an inverted comparison result and a delayed comparison result.

16. The voltage regulator of claim 15, wherein the fifth main control signal generator comprises:
   a sixth inverter which inverts the comparison result from the comparator and outputs a result of the inversion as the inverted comparison result; and
   a seventh inverter which inverts the output from the sixth inverter and outputs a result of the inversion as the delayed comparison result.

17. The voltage regulator of claim 5, wherein:
   the first switching stage comprises a plurality of first switches; and
   each of the first switches connects the feedback voltage to an associated one of the nodes among the string resistors in response to the first select signal.

18. The voltage regulator of claim 15, wherein the second switching stage comprises a plurality of second switches.

19. The voltage regulator of claim 18, wherein each of the second switches comprises:
   a first connector which transfers voltages of first and second associated ones of the nodes among the string resistors in response to the output from the fourth main control signal generator; and
   a second connector which transfers one of the voltages of the first and second associated ones of the nodes to the terminal of the comparator to which the comparison voltage is applied in response to the output from the fifth main control signal generator.

* * * * *